(12) United States Patent
Jin et al.

(10) Patent No.: US 11,693,030 B2
(45) Date of Patent: Jul. 4, 2023

(54) PROBE DEVICE, TEST DEVICE, AND TEST METHOD FOR SEMICONDUCTOR DEVICE

(71) Applicant: Samsung Electronics Co., Ltd., Suwon-si (KR)

(72) Inventors: Hyungmin Jin, Suwon-si (KR); Jindo Byun, Suwon-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 17/308,974

(22) Filed: May 5, 2021

(65) Prior Publication Data

US 2022/0091158 A1  Mar. 24, 2022

(30) Foreign Application Priority Data

Sep. 22, 2020 (KR) ........................ 10-2020-0122196

(51) Int. Cl.
  *G01R 1/20* (2006.01)
  *G01R 1/067* (2006.01)
  *G01R 31/26* (2020.01)

(52) U.S. Cl.
  CPC ......... *G01R 1/203* (2013.01); *G01R 1/06766* (2013.01); *G01R 31/2601* (2013.01)

(58) Field of Classification Search
  CPC ............ H01L 2924/14; G01R 31/2886; G01R 1/06711; G01R 31/2884
  See application file for complete search history.

(56) References Cited

U.S. PATENT DOCUMENTS

| | | | |
|---|---|---|---|
| 6,362,614 B2 | 3/2002 | Draving | |
| 7,372,294 B2 | 5/2008 | Kim | |
| 7,634,370 B2 | 12/2009 | Kawabata | |
| 7,804,323 B2 | 9/2010 | Kim et al. | |
| 8,384,423 B2 | 2/2013 | Nguyen et al. | |
| 9,568,498 B2 | 2/2017 | Moreira et al. | |
| 9,870,808 B2 | 1/2018 | Lee et al. | |
| 10,128,842 B1 | 11/2018 | Lin | |
| 2003/0093713 A1 | 5/2003 | Werner et al. | |

(Continued)

FOREIGN PATENT DOCUMENTS

| | | | |
|---|---|---|---|
| JP | H06130108 A | 5/1994 | |
| JP | 2012244577 A | 12/2012 | |
| KR | 1020000040293 A | 7/2000 | |

*Primary Examiner* — Jermele M Hollington
*Assistant Examiner* — Temilade S Rhodes-Vivour
(74) *Attorney, Agent, or Firm* — Muir Patent Law, PLLC

(57) ABSTRACT

A probe device includes a first receiving terminal configured to receive a multi-level signal having M levels, where M is a natural number greater than 2; a second receiving terminal configured to receive a reference signal; a receiving buffer including a first input terminal connected to the first receiving terminal, a second input terminal connected to the second receiving terminal, and an output terminal configured to output the multi-level signal based on signals received from the first and second input terminals; and a resistor circuit comprising a plurality of resistors connected to the first and second receiving terminals and determining a magnitude of a termination resistance of the first and second receiving terminals.

20 Claims, 21 Drawing Sheets

(56) References Cited

U.S. PATENT DOCUMENTS

| | | | |
|---|---|---|---|
| 2003/0097620 A1* | 5/2003 | Ohno | G11C 29/50012 |
| | | | 714/700 |
| 2003/0206048 A1* | 11/2003 | Toyoshima | H04L 25/061 |
| | | | 327/524 |
| 2009/0002003 A1 | 1/2009 | Kim et al. | |
| 2010/0065963 A1* | 3/2010 | Eldridge | H01L 24/78 |
| | | | 257/734 |
| 2010/0291749 A1* | 11/2010 | Or-Bach | H01L 25/18 |
| | | | 257/E21.598 |
| 2010/0295136 A1* | 11/2010 | Or-Bach | H01L 21/84 |
| | | | 257/390 |
| 2012/0129301 A1* | 5/2012 | Or-Bach | H01L 29/66833 |
| | | | 438/129 |
| 2019/0394071 A1 | 12/2019 | Farzan et al. | |

* cited by examiner

PROBE DEVICE, TEST DEVICE, AND TEST METHOD FOR SEMICONDUCTOR DEVICE

CROSS-REFERENCE TO RELATED APPLICATION(S)

This application claims the benefit under 35 USC 119(a) of Korean Patent Application No. 10-2020-0122196 filed on Sep. 22, 2020 in the Korean Intellectual Property Office, the disclosure of which is incorporated herein by reference in its entirety.

BACKGROUND

The present disclosure of the inventive concept relates to a probe device, a test device, and a test method for a semiconductor device.

Semiconductor devices may exchange signals with other semiconductor devices in various manner, and transmitting-side semiconductor devices may encode data into the signal and transmit the same to receiving-side semiconductor devices. In order to improve a communications speed between semiconductor devices, various methods of using a multi-level signal different from a non-return-zero (NRZ) signal have recently been proposed.

SUMMARY

The present disclosure of the inventive concept is to provide a probe device and a test device, capable of accurately detecting and testing a multi-level signal output by a semiconductor device, by connecting a resistor circuit controlling a termination resistance to receiving terminals, and a test method for a semiconductor device using the same.

According to an example embodiment, a probe device includes a first receiving terminal configured to receive a multi-level signal having M levels, where M is a natural number greater than 2; a second receiving terminal configured to receive a reference signal; a receiving buffer including a first input terminal connected to the first receiving terminal, a second input terminal connected to the second receiving terminal, and an output terminal configured to output the multi-level signal based on signals received from the first input terminal and the second input terminal; and a resistor circuit comprising a plurality of resistors connected to the first receiving terminal and the second receiving terminal and determining a magnitude of a termination resistance of the first receiving terminal and the second receiving terminal.

According to an example embodiment, a test device includes a probe device configured to contact an output pad of a semiconductor device configured to output a multi-level signal having M levels, where M is a natural number greater than 2; and a control device configured to receive the multi-level signal from the probe device and test the semiconductor device using the multi-level signal, wherein the probe device comprises a resistor circuit having: a first receiving terminal configured to receive the multi-level signal, a second receiving terminal configured to receive a reference signal, and a plurality of resistors connected to the first receiving terminal and the second receiving terminal, and the control device configured to determine a resistance value of the resistor circuit, as termination resistance value for testing the multi-level signal.

According to an example embodiment, a test method for a semiconductor device includes contacting a first pin and a second pin of a probe device to a signal pad and a ground pad of the semiconductor device; setting a resistance value of each of a plurality of variable resistors, in the probe device, connected to the first pin and the second pin according to a termination mode of the semiconductor device; supplying a power voltage to the semiconductor device; and verifying a multi-level signal output from the signal pad by the semiconductor device, wherein the multi-level signal is a pulse amplitude-modulation signal having M levels, where M is a natural number greater than 2.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments will be described with reference to the accompanying drawings.

Figure 1:
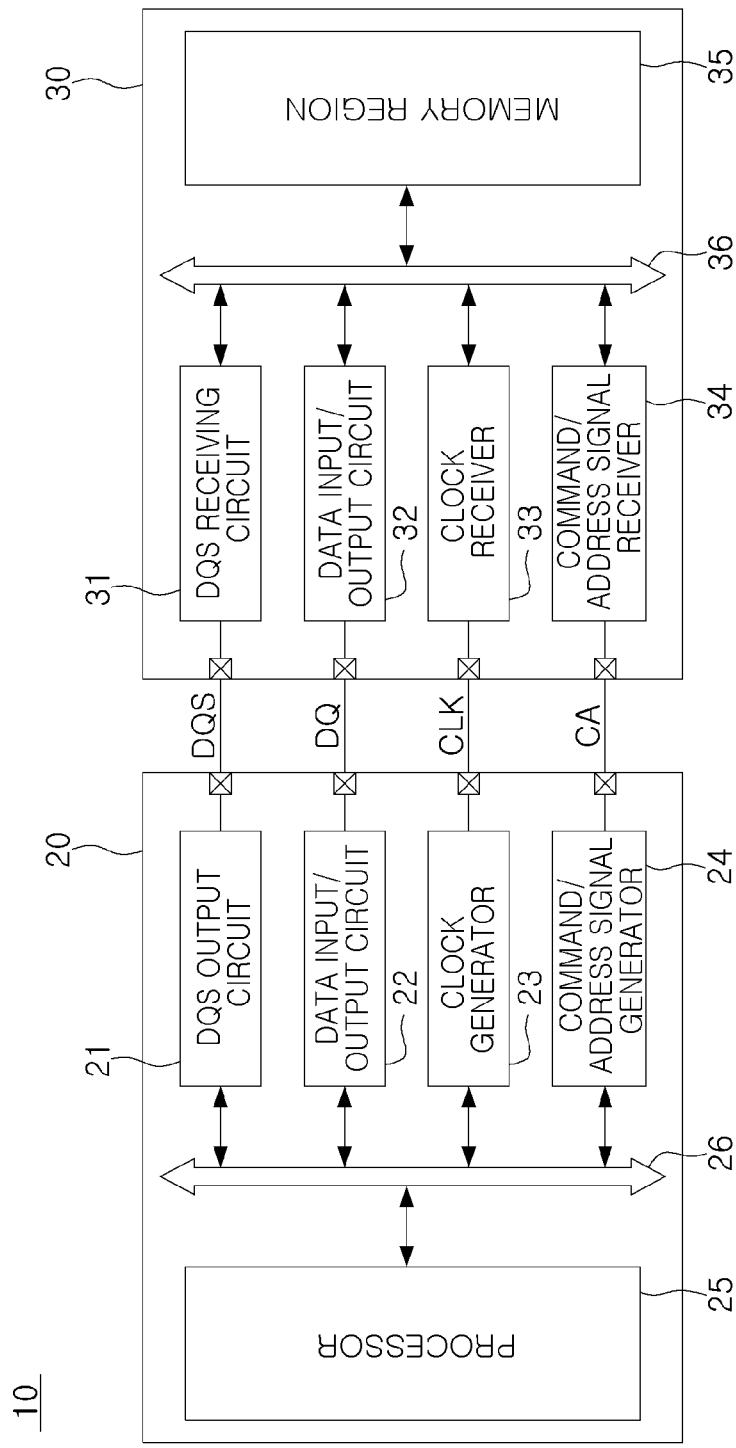
FIG. 1 is a diagram simply illustrating a system including a semiconductor device according to an example embodiment.

FIG. 1 is a diagram simply illustrating a system including a semiconductor device according to an example embodiment.

Referring to FIG. 1, a system 10 including a semiconductor device according to an example embodiment includes a memory controller 20 and a memory device 30, and the memory controller 20 and the memory device 30 may exchange a multi-level signal having M levels, where M is a natural number greater than 2 through at least one of a plurality of channels (DQ, CLK, CA and DQS). However, the semiconductor device according to an example embodiment is not limited to the memory controller 20 or the memory device 30, and should be understood as including all semiconductor devices capable of outputting multi-level signals to other semiconductor devices.

The semiconductor device according to an example embodiment may be the memory controller 20 and/or the memory device 30, and for example, may transmit and/or receive a multi-level signal through a data channel DQ. Depending on example embodiments, however, the multi-level signal may be transmitted through at least one of a clock channel CLK, a data strobe channel DQS, and a command/address channel CA.

The memory controller 20 may include a DQS output circuit 21, a data input/output circuit 22, a clock generating circuit 23 (e.g., a clock generator), a command/address signal generator 24, a processor 25, and the like. The processor 25 may include at least one core. The components 21 to 25 included in the controller 20 may exchange data with each other through a bus 26. The memory device 30 may include a DQS receiving circuit 31, a data input/output circuit 32, a clock receiver 33, a command/address signal receiver 34, and a memory region 35. The components 31 to 35 included in the memory device 30 may exchange data with each other through a bus 36. The memory region 35 may include a memory bank having a plurality of memory cells.

As an example, the memory device 30 may receive the multi-level signal from the memory controller 20 through the data channel DQ. As previously described, the multi-level signal may have M levels, and M may be defined as a power of 2. As an example, when M is 2N, N bits of data may be transmitted from the memory controller 20 to the memory device 30 during one period of the multi-level signal.

In order for the memory controller 20 and the memory device 30 to accurately exchange the multi-level signal with each other, be necessary to accurately measure mismatches, and the like, between the M levels in the multi-level signal output from the memory controller 20 and/or the memory device 30 during manufacturing. However, an absolute value of each of the M levels included in the multi-level signal may vary depending on a termination resistance connected to a driver outputting the multi-level signal. Accordingly, by detecting the multi-level signal while having an appropriate termination resistance connected to the driver, characteristics of the multi-level signal can be accurately tested.

When the packaging of the semiconductor device is completed, the semiconductor device is mounted on a test board, and the characteristics of the multi-level signal can be tested in a state in which the semiconductor device is actually connected to another semiconductor device. Accordingly, the driver can output a multi-level signal while having the termination resistance connected thereto, and the characteristic of the multi-level signal can be accurately detected. In contrast, it may be difficult to perform an accurate test by connecting the termination resistance to the driver of the semiconductor device at, for example, a wafer level, before packaging is completed.

In an example embodiment, the probe device capable of measuring a multi-level signal by contacting a pad, or the like, of the semiconductor device at the wafer level may include a resistor circuit capable of setting termination resistance level optimized for the driver. The resistor circuit includes a plurality of resistors connected to a pin of the probe device in contact with the pad of the semiconductor device, and may set a termination resistance level according to various termination modes and required resistance values. Accordingly, the characteristics of the multi-level signal output from the semiconductor device can be accurately measured even before packaging the semiconductor device, and a ZQ calibration can be accurately performed.

Figure 2:
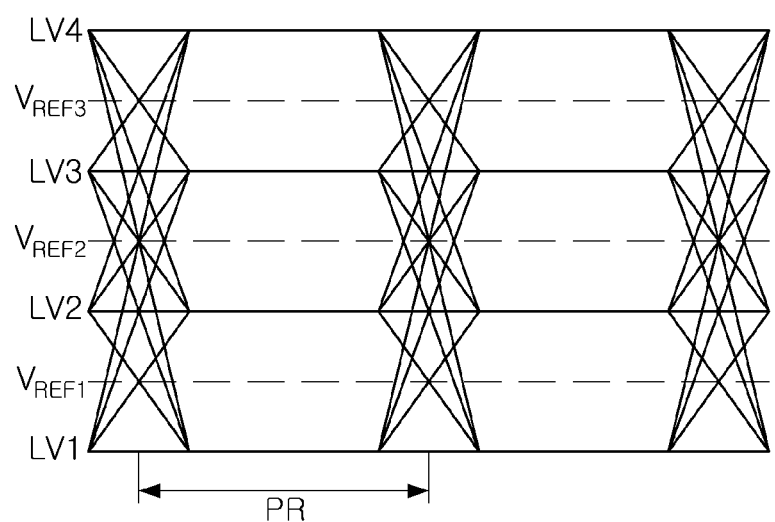
FIGS. 2 and 3 are diagrams illustrating a multi-level signal output by a semiconductor device according to an example embodiment.
Figure 3:
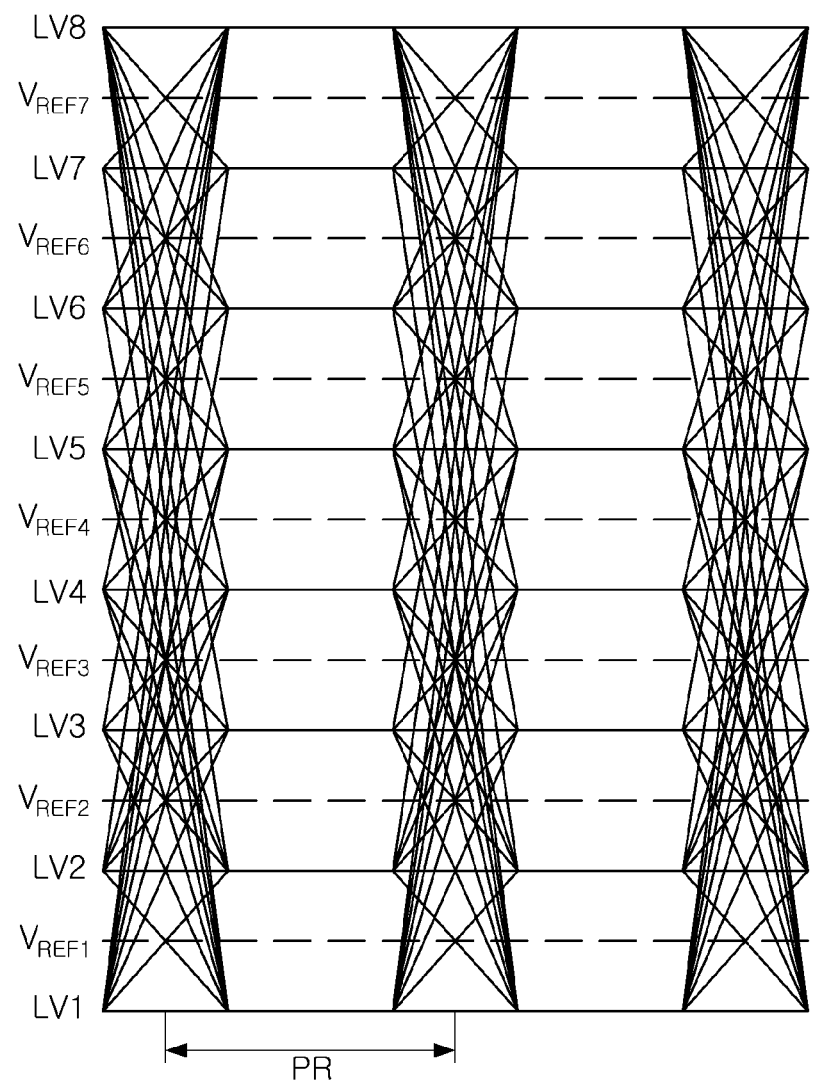

FIGS. 2 and 3 are diagrams illustrating a multi-level signal output by a semiconductor device according to an example embodiment.

Referring to FIG. 2, a multi-level signal output by the semiconductor device in an example embodiment may have four levels LV1 to LV4. In the example embodiment illustrated in FIG. 2, the semiconductor device may generate a multi-level signal based on a 4-level pulse amplitude modulation (PAM-4) method. When data is transmitted as a multi-level signal generated based on the PAM-4 method, two data bits may be transmitted during one data transmission period (PR).

As an example, the four levels LV1 to LV4 may correspond to data of [00], [01], [10] and [11], respectively. Accordingly, the semiconductor device may transmit two bits, for example, one of [00], [10], [01] and [11], during one data transmission period PR. The semiconductor device, which receives the multi-level signal, may include a multi-level receiver which restores data from the multi-level signal. The multi-level receiver may include a plurality of sense amplifiers, and the plurality of sense amplifiers may compare the multi-level signal with a plurality of reference signals $V_{REF1}$ to $V_{REF3}$.

Referring to FIG. 3, a multi-level signal output from the semiconductor device in an example embodiment may have eight levels LV1 to LV8. In the example embodiment illustrated in FIG. 3, the semiconductor device may generate a multi-level signal based on an 8-level pulse amplitude modulation (PAM-8) method. When data is transmitted as a multi-level signal generated based on the PAM-8 method, three data bits may be transmitted during one data transmission period (PR).

As an example, the eight levels LV1 to LV8 may correspond to data of [000], [001], [010], [011], [100], [101], [110] and [111], respectively. Accordingly, the semiconductor device may transmit three bits during one data transmission period PR. In this case, the multi-level receiver may compare the multi-level signal with a plurality of reference signals $V_{REF1}$ to $V_{REF7}$.

Figure 4:
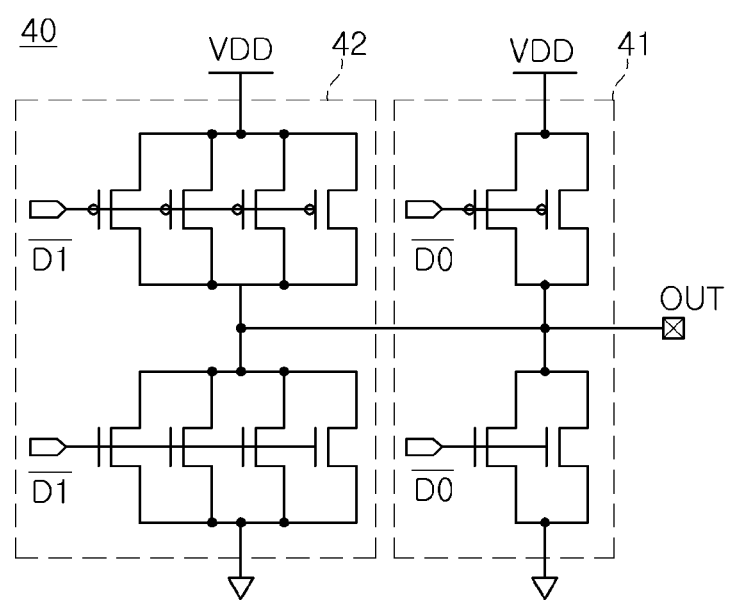
FIGS. 4 and 5 are diagrams simply illustrating a driver generating a multi-level signal in a semiconductor device according to an example embodiment.
Figure 5:
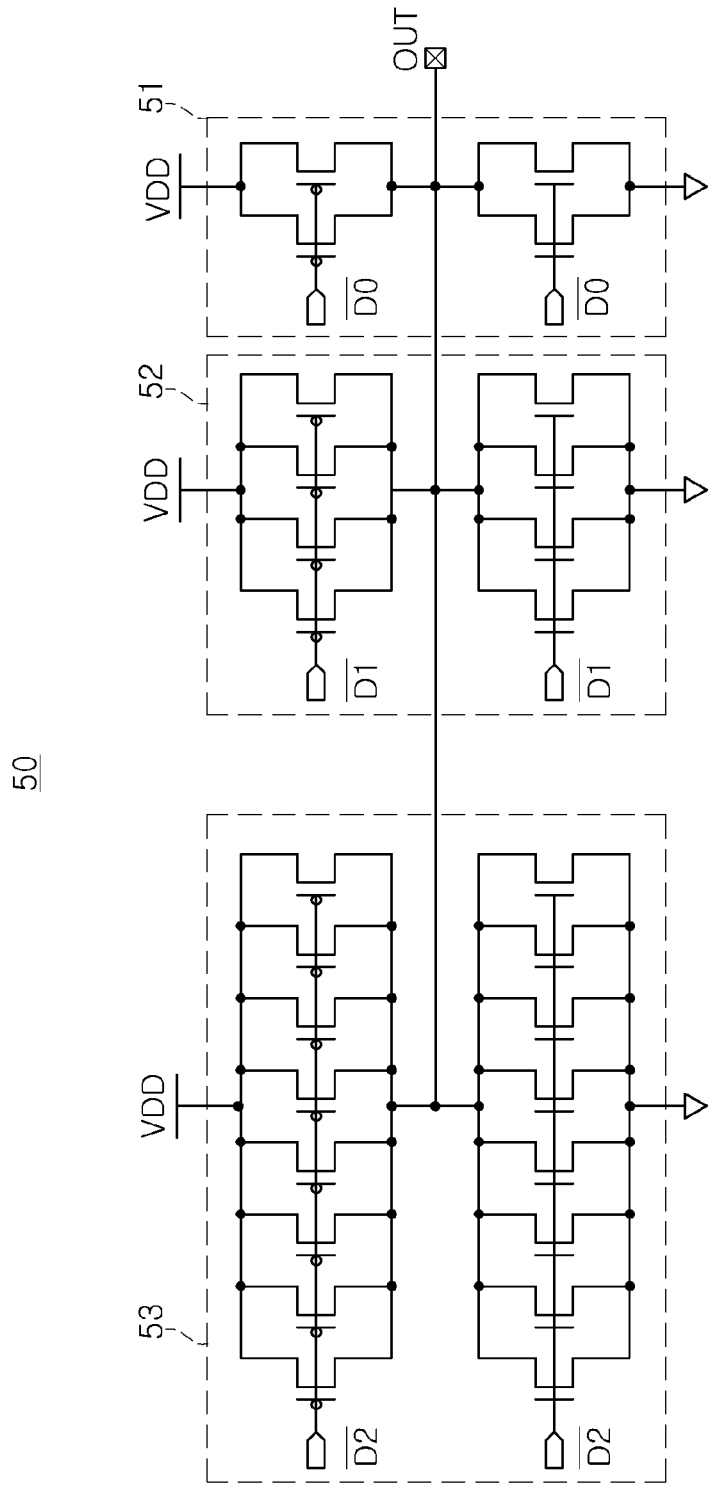

FIGS. 4 and 5 are diagrams simply illustrating a driver generating a multi-level signal in a semiconductor device according to an example embodiment.

A driver 40 according to the example embodiment illustrated in FIG. 4 may output a multi-level signal having four levels. In the example embodiment illustrated in FIG. 4, the driver 40 may include a first driver 41 and a second driver 42. Each of the first driver 41 and the second driver 42 may include PMOS transistors input with a first power voltage VDD and NMOS transistors input with a second power voltage VSS. The second power voltage VSS may be a ground voltage. An output terminal OUT of the driver 40 may be a node connected between the PMOS transistors and the NMOS transistors.

In an example embodiment, the first driver 41 may be controlled by a lower bit D0 of data determining a multi-level signal, and the second driver 42 may be controlled by an upper bit D1 of the data determining a multi-level signal. As an example, a complementary value of the lower bit D0 is input to gates of transistors included in the first driver 41, and a complementary value of the upper bit D1 is input to gates of transistors included in the second driver 42. As described above, the multi-level signal having four levels can transmit 2 bits of data during one data transmission period. As an example, a level of the multi-level signal according to data and operations of the first driver 41 and the second driver 42 may be as shown in FIG. 2 and Table 1 below.

TABLE 1

| DATA | | | | |
|---|---|---|---|---|
| D1 | D0 | LEVEL | 1$^{ST}$ DRIVER | 2$^{ND}$ DRIVER |
| 0 | 0 | LV1 | NMOS TURNED ON | NMOS TURNED ON |
| 0 | 1 | LV2 | PMOS TURNED ON | NMOS TURNED ON |
| 1 | 0 | LV3 | NMOS TURNED ON | PMOS TURNED ON |
| 1 | 1 | LV4 | PMOS TURNED ON | PMOS TURNED ON |

Meanwhile, a driver 50 according to the example embodiment illustrated in FIG. 5 may output a multi-level signal having eight levels. In the example embodiment illustrated in FIG. 5, the driver 50 may include first to third drivers 51 to 53. Each of the first to third drivers 51 to 53 may include PMOS transistors receiving a first power voltage VDD and NMOS transistors receiving a second power voltage VSS.

The transistors of the first driver 51 are controlled by a complementary value of a lower bit D0 of data determining a multi-level signal, and the transistors of the second driver 52 are controlled by a complementary value of an intermediate bit D1 of the data determining a multi-level signal, while the transistors of the third driver 53 may be controlled by a complementary value of an upper bit D2 of the data determining a multi-level signal. As an example, a level of the multi-level signal according to data and operations of the first to third drivers 51 to 53 may be as shown in FIG. 3 and Table 2 below.

TABLE 2

| DATA | | | | | | |
|---|---|---|---|---|---|---|
| D2 | D1 | D0 | LEVEL | 1$^{ST}$ DRIVER | 2$^{ND}$ DRIVER | 3$^{RD}$ DRIVER |
| 0 | 0 | 0 | LV1 | NMOS TURNED ON | NMOS TURNED ON | NMOS TURNED ON |
| 0 | 0 | 1 | LV2 | PMOS TURNED ON | NMOS TURNED ON | NMOS TURNED ON |
| 0 | 1 | 0 | LV3 | NMOS TURNED ON | PMOS TURNED ON | NMOS TURNED ON |
| 0 | 1 | 1 | LV4 | PMOS TURNED ON | PMOS TURNED ON | NMOS TURNED ON |
| 1 | 0 | 0 | LV5 | NMOS TURNED ON | NMOS TURNED ON | PMOS TURNED ON |
| 1 | 0 | 1 | LV6 | PMOS TURNED ON | NMOS TURNED ON | PMOS TURNED ON |
| 1 | 1 | 0 | LV7 | NMOS TURNED ON | PMOS TURNED ON | PMOS TURNED ON |
| 1 | 1 | 1 | LV8 | PMOS TURNED ON | PMOS TURNED ON | PMOS TURNED ON |

In the example embodiments described with reference to FIGS. 4 and 5, an absolute value of each of the levels LV1 to LV4 and LV1 to LV8 may vary depending on a magnitude of a termination resistance connected to the output terminal OUT of each of the drivers 40 and 50. Accordingly, in order to accurately test mismatches of the levels LV1 to LV4 and LV1 to LV8 output from the drivers 40 and 50, the termination resistance is connected to the output terminals OUT of the drivers 40 and 50.

In an example embodiment, a probe device (e.g., a probe card) in contact with a pad connected to the output terminal OUT in a semiconductor device (e.g., in a wafer state) including at least one of the drivers 40 and 50 may include a resistor circuit capable of setting a termination resistance. The resistor circuit includes a plurality of resistors, and at least one of the plurality of resistors may be a variable resistor. Accordingly, a wafer-level test can be performed while having a termination resistance connected to the drivers 40 and 50 included in the semiconductor device, and accuracy of the test can be improved. As an example, since the multi-level signal can be detected while the termination resistor is connected, a ratio of level mismatch (RLM), or the like, can be accurately tested. In addition, in a situation in which there is no external reference resistance, a ZQ calibration test can be performed while changing a resistance value of the termination resistance.

Figure 6:
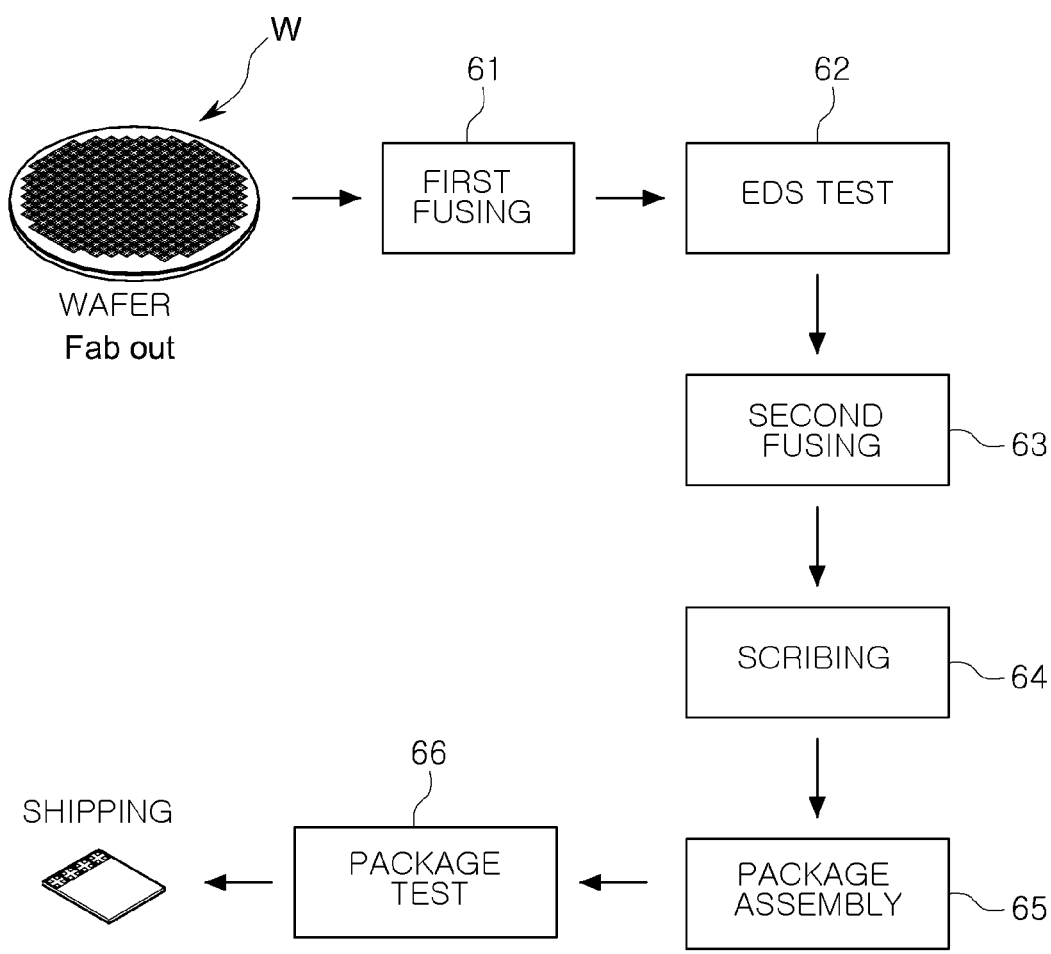
FIG. 6 is a diagram provided to illustrate a process of manufacturing a semiconductor device according to an example embodiment.

FIG. 6 is a diagram provided to illustrate a process of manufacturing a semiconductor device according to an example embodiment.

Referring to FIG. 6, a plurality of semiconductor devices are produced by applying semiconductor processes to a wafer W, and the wafer W may be fabbed out. The semiconductor devices may be disposed on the wafer W in the form of a semiconductor die. When the wafer W is fabbed out, first fusing 61 involving writing data to first fuse elements may be performed. Data written in the first fuse elements by the first fusing may include customization data, repair data, and data related to production/manufacturing histories of the semiconductor devices.

Once the first fusing 61 is completed, an EDS test 62 may be carried out. According to example embodiments, the EDS test 62 may include a plurality of tests sequentially performed in different environments. As an example, the EDS test 62 may include a first EDS test and a second EDS test, where the first EDS test is performed in a relatively high temperature environment and the second EDS test is performed in a relatively low temperature environment. When the EDS test 62 is completed, second fusing 63 involving re-writing the data of the fuse elements may be performed. The second fusing 63 may be a procedure performed in consideration of a possibility that the data of fuse elements may be deformed during the EDS test, or the like. When the second fusing 63 is completed, a scribing process 64 involving separating semiconductor dies and a package assembly process 65 may be performed.

A packaging test 66 can be proceeded with after the package assembly process 65. As an example, the packaging test 66 may be performed in a state in which a packaging-completed semiconductor device is mounted on a test board, or the like. The semiconductor device may exchange signals with other semiconductor devices through the test board. Accordingly, an actual operation of the semiconductor device through the test board may be tested during the packaging test 66.

In the case in which the semiconductor includes a driver generating and outputting a multi-level signal, a procedure for testing the multi-level signal may generally be performed during the packaging test 66. An absolute value of each of the levels of the multi-level signal may vary according to a termination resistance connected to the driver which outputs the multi-level signal. Accordingly, in order to accurately measure the multi-level signal, the termination resistance needs to be connected to an output terminal of the driver. In the packaging test 66, the semiconductor device is connected to another semiconductor device through the test board, and thus, mismatches, or the like, of levels of the multi-level signal can be accurately measured in a state in which the termination resistance is connected to the output terminal of the driver.

In an example embodiment, a method for accurately testing a multi-level signal is suggested even before the package assembly process 65. The probe device included in the test device and in contact with the output terminal for outputting a multi-level signal may include a resistor circuit. The resistor circuit can be connected to pins in contact with an output terminal to provide a termination resistance necessary for testing the multi-level signal. Accordingly, each level of the multi-level signal can be accurately measured before the package assembly process 65.

Figure 7A:
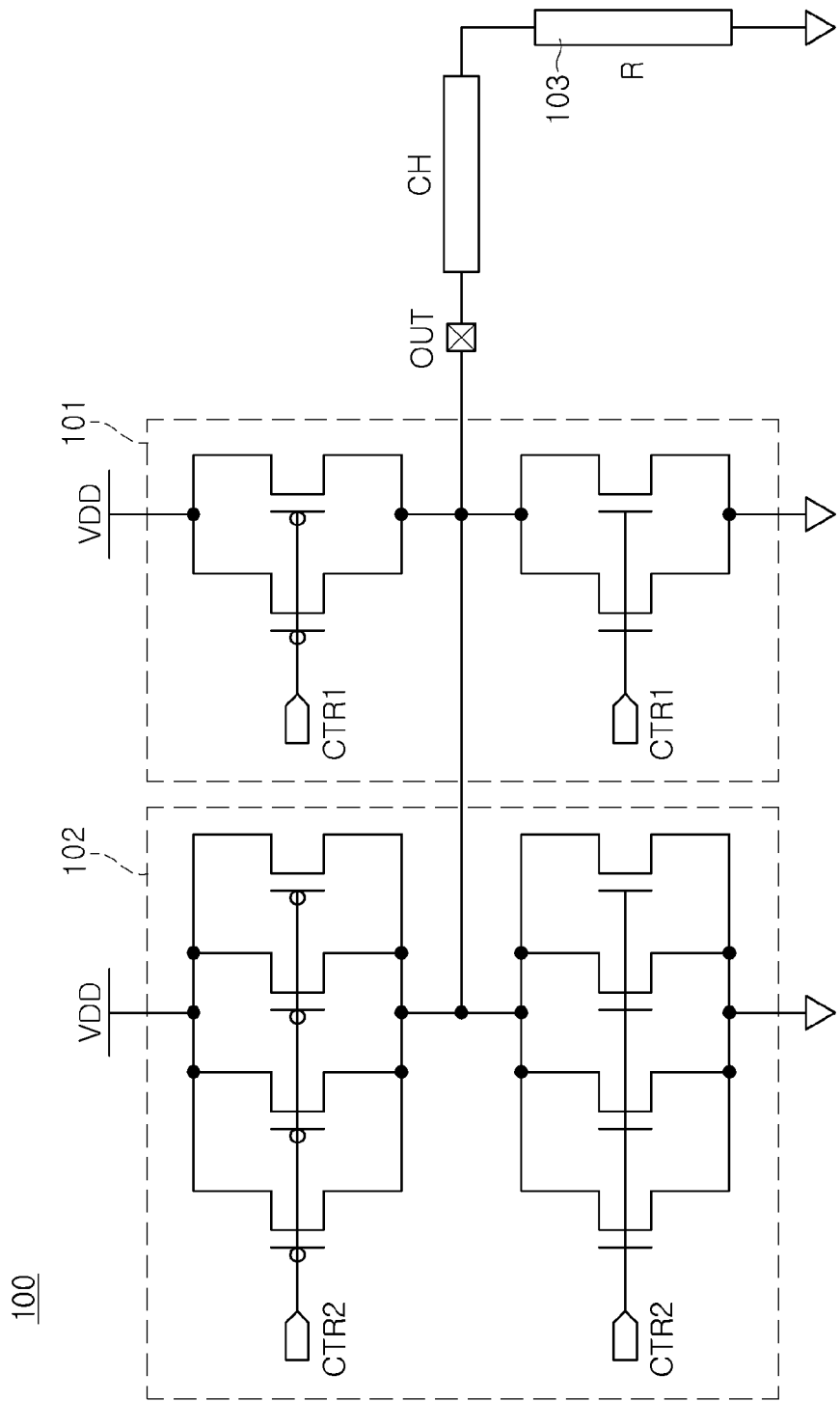
FIGS. 7A, 7B and 8 are diagrams provided to illustrate a test method for a semiconductor device according to an example embodiment.
Figure 7B:
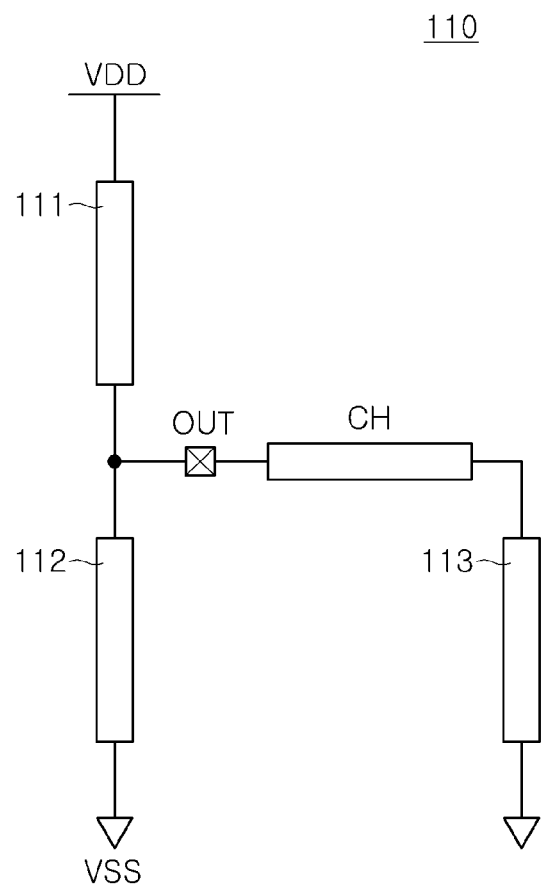
Figure 8:
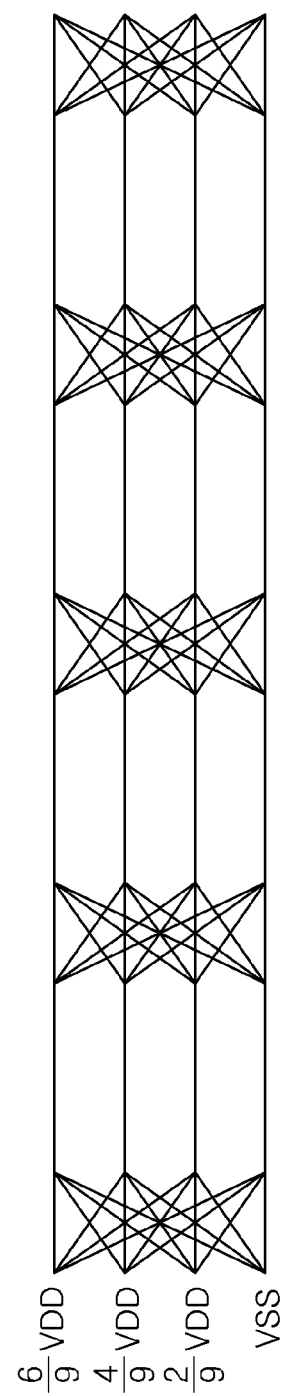

FIGS. 7A, 7B and 8 are diagrams provided to illustrate a test method for a semiconductor device according to an example embodiment.

First, referring to FIG. 7A, a channel CH and a termination resistor 103 may be connected to an output terminal OUT of a driver 100 which outputs a multi-level signal having four levels. The driver 100 includes a first driver 101 and a second driver 102, and an operation of the driver 100 may be as described above with reference to FIG. 4. As an example, a first control signal CTR1 of the first driver 101 may be a complementary value of a lower bit of data determining the level of the multi-level signal, and a second control signal CTR2 of the second driver 102 may be a complementary value of an upper bit of data that determining the level of the multi-level signal.

FIG. 7B may be an equivalent circuit 110 showing the driver 100 shown in FIG. 7A. Referring to the equivalent circuit 110, a pull-up resistor 111 is connected between an output terminal OUT from which a multi-level signal is output and a first power voltage (or, a first power node) VDD, and a pull-down resistor 112 may be connected between the output terminal OUT and a second power voltage (or, a second power node) VSS. The output terminal OUT may be connected to a termination resistor 113 through the channel CH.

A magnitude of each of the pull-up resistor 111 and the pull-down resistor 112 may be determined according to whether the transistors included in the first driver 101 and the second driver 102 are turned on/off. Hereinafter, the case in which resistance values of the channel CH and the termination resistor 113 are R, respectively, and turn-on resistance of each of the transistors included in the driver 100 is 6R will be described. Turn-off resistance of each of the transistors can be assumed to be infinite.

As an example, when data transmitted as a multi-level signal is [00], NMOS transistors in the first and second drivers 101 and 102 may be turned on and PMOS transistors may be turned off by the first control signal CTR1 and the second control signal CTR2. Accordingly, the pull-up resistor 111 is electrically separated from the output terminal OUT, and the resistance value of the pull-down resistor 112 may be R. As the first power node and the output terminal OUT are electrically separated, however, the level of the multi-level signal may be the second power voltage VSS, as illustrated in FIG. 8.

Meanwhile, when the data is [01], the PMOS transistors are turned on in the first driver 101 and the NMOS transistors are turned on in the second driver 102. In this regard, a resistance value of the pull-up resistor 111 is 3R, and a resistance value of the pull-down resistor 112 is 1.5R. The level of the multi-level signal can be determined as 2VDD/9 as shown in FIG. 8. When the data is [10], the NMOS transistors are turned on in the first driver 101, and the PMOS transistors are turned on in the second driver 102. The level of the multi-level signal may be determined as 4VDD/9. When the data is [11], the PMOS transistors in the first and second drivers 101 and 102 are turned on such that the level of the multi-level signal may be 6VDD/9.

In the case in which a resistance value of the channel CH is 0 and a resistance value of the termination resistor 113 is R, when the data transmitted as a multi-level signal is [00], the level of the multi-level signal may be determined as the second power voltage VSS, when the data transmitted as a multi-level signal is [01], the level of the multi-level signal may be determined as VDD/6, when the data transmitted as a multi-level signal is [10], the level of the multi-level signal may be determined as 2VDD/6, and when the data transmitted as a multi-level signal is [11], the level of the multi-level signal may be determined as 3VDD/6.

As shown in the example embodiments described with reference to FIGS. 7A, 7B and 8, a magnitude of each of the levels of the multi-level signal may vary according to the resistance value of the termination resistor. As an example, when the terminating resistor is not connected or the resistance value of the terminating resistor is changed, the magnitude of each of the levels of the multi-level signal may vary. As such, in order to accurately test the characteristics, for example, a ratio of level mismatch (RLM), of the multi-level signal, a test needs to be carried out in a state in which the termination resistor, such as an actual operating environment of a semiconductor device, is connected to the output terminal OUT of the driver 100.

In an example embodiment, accuracy of test processes may be improved by including a resistor circuit capable of setting an end-of-line resistance level in a probe device. As an example, when a multi-level signal is detected by a conventional probe device excluding a resistor circuit, the multi-level signal having different levels may be detected when compared to that in an actual operating environment of the semiconductor device. This will be described with reference to FIGS. 9A, 9B and 10.

Figure 9A:
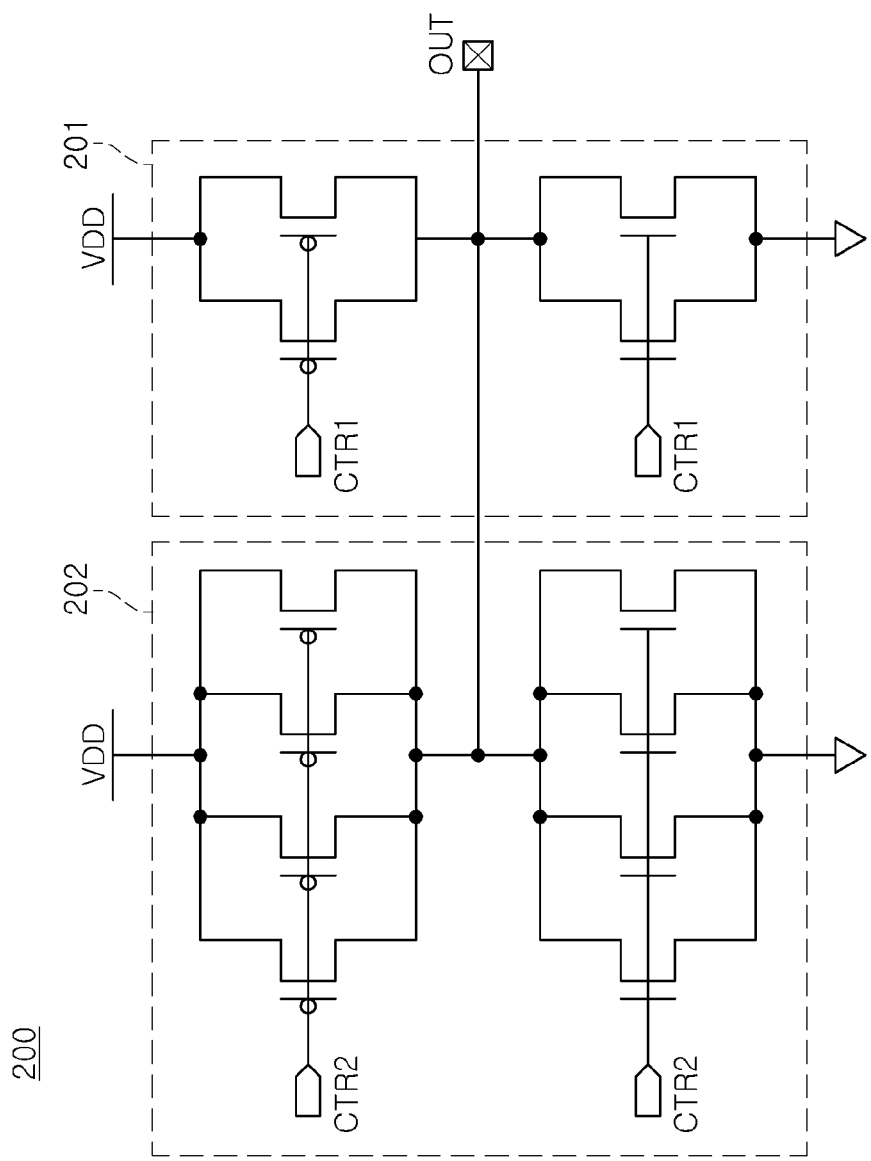
FIGS. 9A, 9B and 10 are diagrams illustrating a comparative example for illustrating a test method for a semiconductor device according to an example embodiment.
Figure 9B:
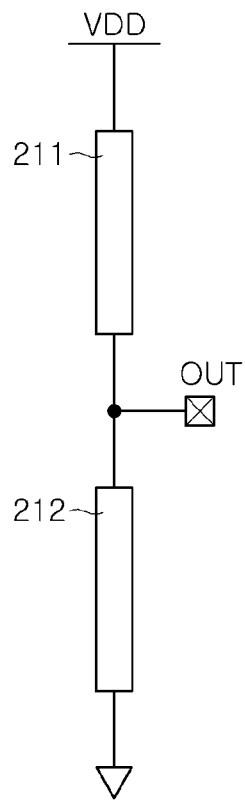
Figure 10:
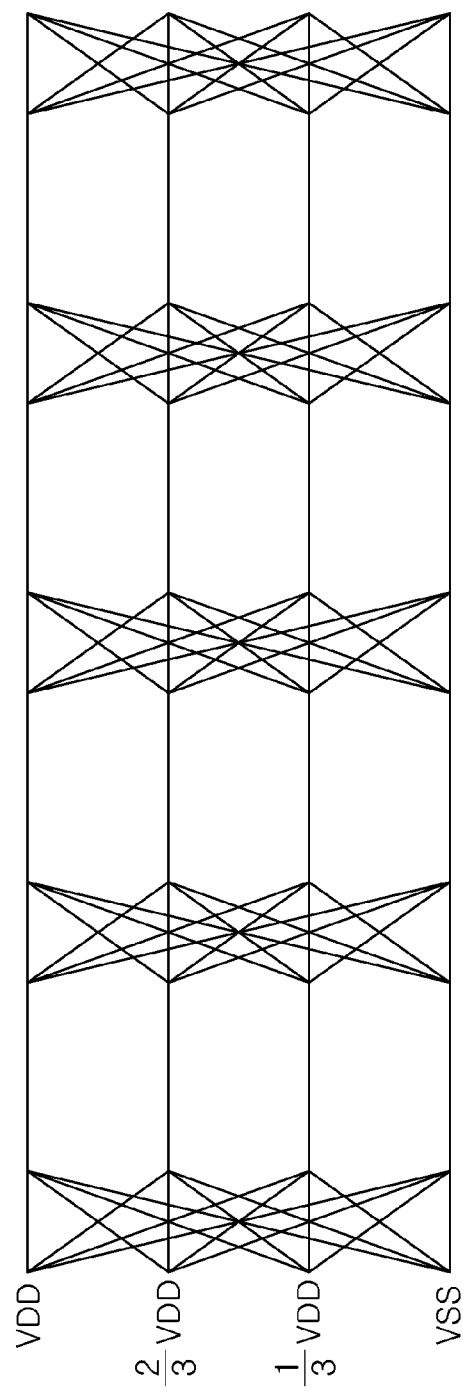

FIGS. 9A, 9B and 10 are diagrams illustrating a comparative example for illustrating a test method for a semiconductor device according to an example embodiment.

FIG. 9A is a circuit diagram illustrating a driver 200, and a structure and an operation method may be similar to those described with reference to FIG. 7A. FIG. 9B illustrates an equivalent circuit 210 of the driver 200, a magnitude of a pull-up resistor 211 may be determined by turning on/off of PMOS transistors included in the driver 200, while a magnitude of a pull-down resistor 212 may be determined by turning on/off of the NMOS transistors included in the driver 200.

Similarly to the example embodiments described with reference to FIGS. 7A, 7B and 8, a level of a multi-level signal may be a second power voltage VSS as illustrated in FIG. 10 when the data is [00], assuming that resistance of each transistor is 6R. In contrast, the levels of the multi-level signal are VDD/3 and 2VDD/3 when the data are [01] and [10], respectively. When the data is [11], the level of the multi-level signal may be detected to be VDD.

For example, when the termination resistor is not connected to the output terminal OUT, the level of the multi-level signal may differ from those of the cases in which the termination resistor is connected to the output terminal OUT. Accordingly, it may not be possible to accurately test how the driver 200 outputs a multi-level signal in an actual operating environment with a conventional probe device to which the termination resistor may be not connected. In contrast, the probe device according to an example embodiment includes a resistor circuit capable of setting a magnitude of the termination resistor, and may thus accurately test the operation of the driver 200 using the termination resistor having a resistance value equal to a resistance value of the actual operating environment.

Figure 11:
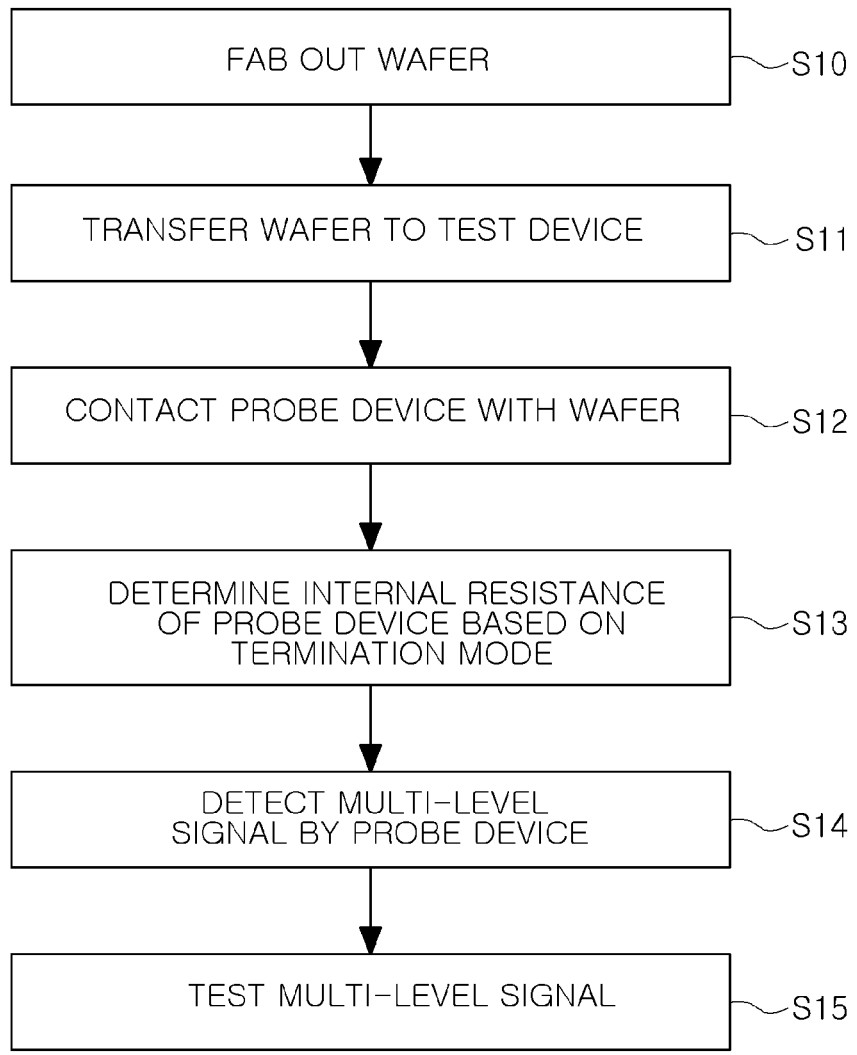
FIG. 11 is a flowchart illustrating a test method for a semiconductor device according to an example embodiment.

FIG. 11 is a flowchart illustrating a test method for a semiconductor device according to an example embodiment.

Referring to FIG. 11, a test method for a semiconductor device according to an example embodiment may be initiated by manufacturing semiconductor devices by carrying out a semiconductor process on a wafer and fabbing out the wafer in S10. The fabbed-out wafer may be in the state in which a scribing process, or the like, has not yet been applied. The fabbed-out wafer may be moved to a test device in S11.

The test device is a device for performing a test on a semiconductor device formed on a wafer, and may be, for example, a probe station. In an example embodiment, the test device may include a probe device on which a plurality of probe pins are mounted, and a control device for testing a semiconductor device using a signal measured by the probe device. According to example embodiments, the test device may contact two or more semiconductor devices with a probe device and simultaneously perform a test on two or more semiconductor devices.

When the wafer moves to the test device, the probe device may contact the wafer in S12. The probe device includes a plurality of pins externally exposed, and the plurality of pins may contact pads formed on each of the semiconductor devices of the wafer. In the case of detecting and testing characteristics of a multi-level signal with the probe device, a first pin and a second pin included in the probe device may be connected to an output pad outputting the multi-level signal and a reference pad adjacent to the output pad, respectively. The reference pad may be a pad connected to a predetermined reference voltage.

When the probe device contacts the wafer, resistance inside the probe device may be set according to a termination mode in S13. The probe device includes a resistor circuit connected to the first pin and the second pin. As an example, a resistor circuit may include a plurality of variable resistors connected to the first pin and the second pin. In S13, a control device of the test device may set a resistance value of each of the variable resistors and a termination mode according to the actual operating environment of the semiconductor device connected to the probe device.

When a magnitude of the termination resistance is set by the resistor circuit included in the probe device, a power is supplied to the semiconductor device of the wafer, and the probe device may detect a multi-level signal in S14. The control device may test the multi-level signal detected by the probe device in S15. As previously described, the probe device provides a termination resistor having a resistance level being equal to or close to equal a resistance value in the actual operating environment of the semiconductor device, and may thus accurately detect a mismatch of the level of the multi-level signal and accurately perform ZQ calibration of the driver outputting the multi-level signal.

Figure 12:
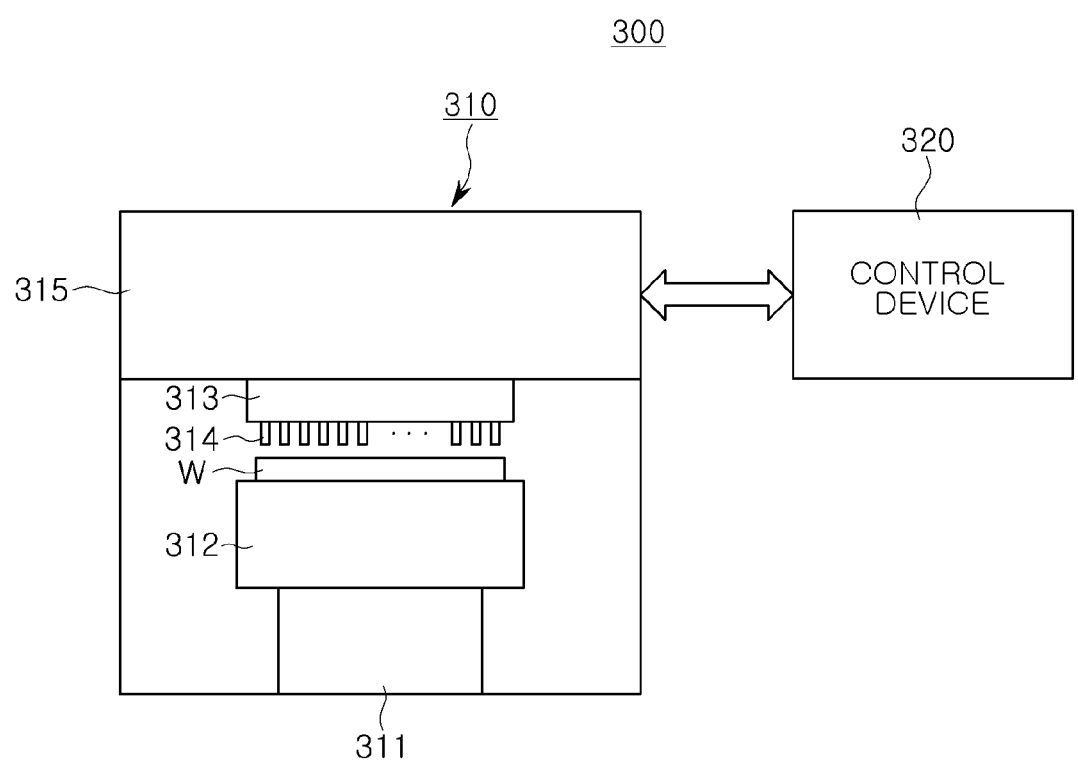
FIGS. 12 and 13 are diagrams simply illustrating a test device according to an example embodiment.
Figure 13:
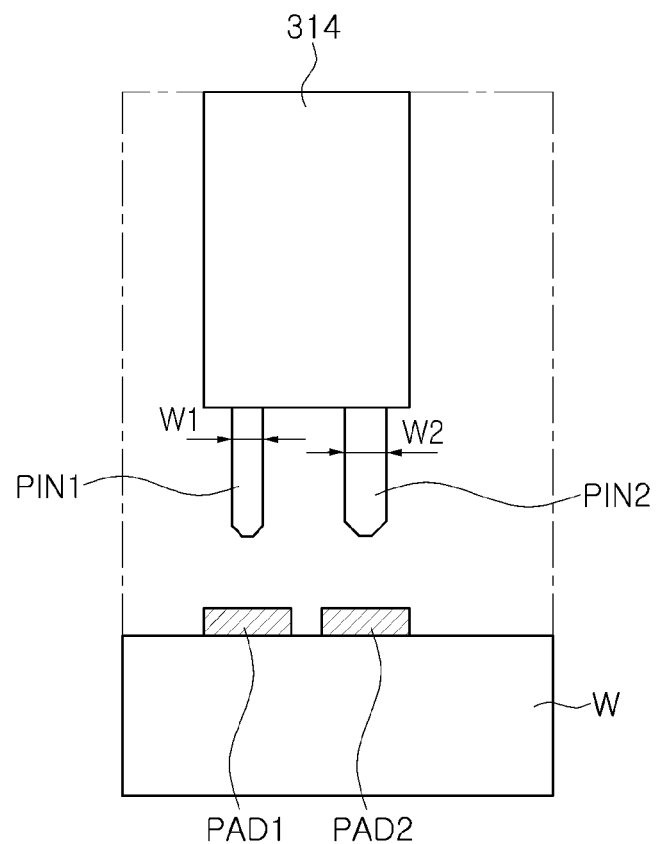

FIGS. 12 and 13 are diagrams simply illustrating a test device according to an example embodiment.

Referring to FIG. 12, a test device 300 according to an example embodiment may include a probe station 310 and a control device 320. The probe station 310 may include a first stage 311 and a second stage 312 on which a wafer W is mounted, a probe holder 313 on which the probe devices 314 are mounted, and a probe head 315 for receiving signals from the probe devices 314. The probe head 315 may be connected to enable communication with the control device 320.

When the wafer W is seated on the stages 311 and 312 by a wafer transfer device, or the like, a position of the wafer W is adjusted by the first and second stages 311 and 312 to be aligned with the probe devices 314. As an example, the first stage 311 may adjust the position of the wafer W in a horizontal direction, while the second stage 312 may adjust the position of the wafer W in a vertical direction.

Each of the probe devices 314 may include pins in contact with pads formed on semiconductor devices of the wafer W. When each of the semiconductor devices of the wafer W includes a driver which outputs a multi-level signal, each of the probe devices 314 may include a first pin PIN1 in contact with an output pad PAD1 outputting the multi-level signal and a second pin PIN2 in contact with a reference pad PAD2 disposed adjacent to the output pad PAD1, as illustrated in FIG. 13. According to example embodiments, a second width W2 of the second fin PIN2 may be greater than a first width W1 of the first fin PIN1 in a first direction. As an example, when the semiconductor device is a memory device, the output pad PAD1 outputting the multi-level signal may be a data output pad outputting a data signal.

Prior to initiating a test and detecting the multi-level signal, a resistance value of a resistor circuit connected between the first pin PIN1 and the second pin PIN2 in each of the probe devices 314 may be adjusted. In this case, the resistance value of the resistor circuit may be determined in consideration of a termination mode and a magnitude of a termination resistor according to an actual operating environment of the semiconductor device. When the test begins, the multi-level signal detected by each of the probe devices 314 may be transmitted to the control device 320. In an example embodiment, the control device 320 may include a device capable of detecting a level of a multi-level signal, such as an oscilloscope.

Figure 14:
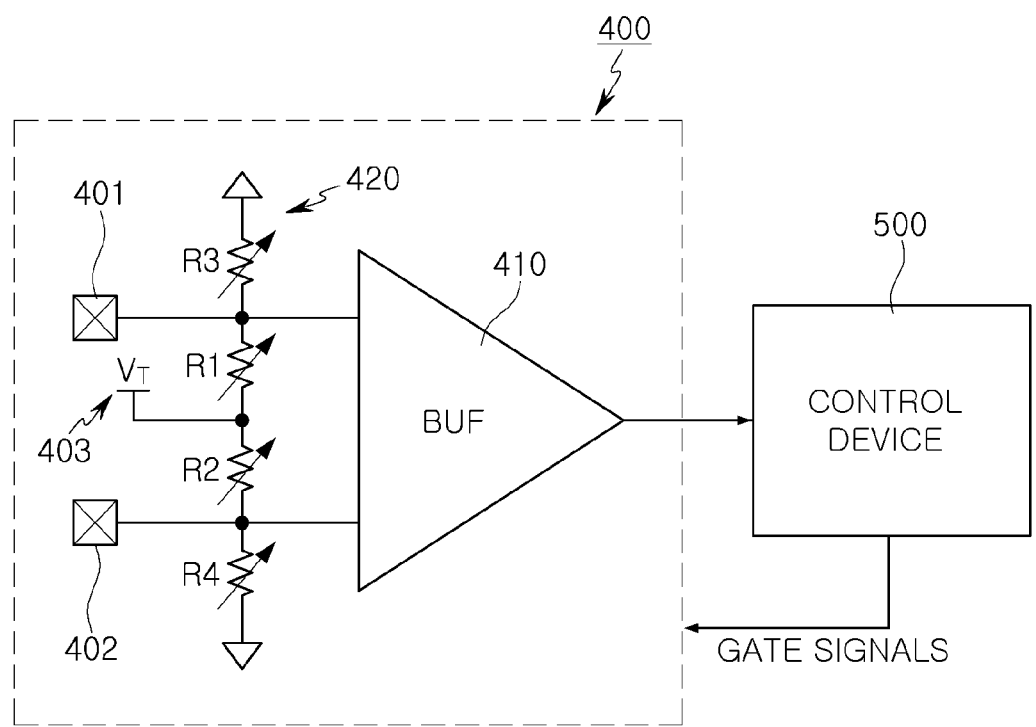
FIGS. 14 and 15 are diagrams simply illustrating a probe device according to an example embodiment.
Figure 15:
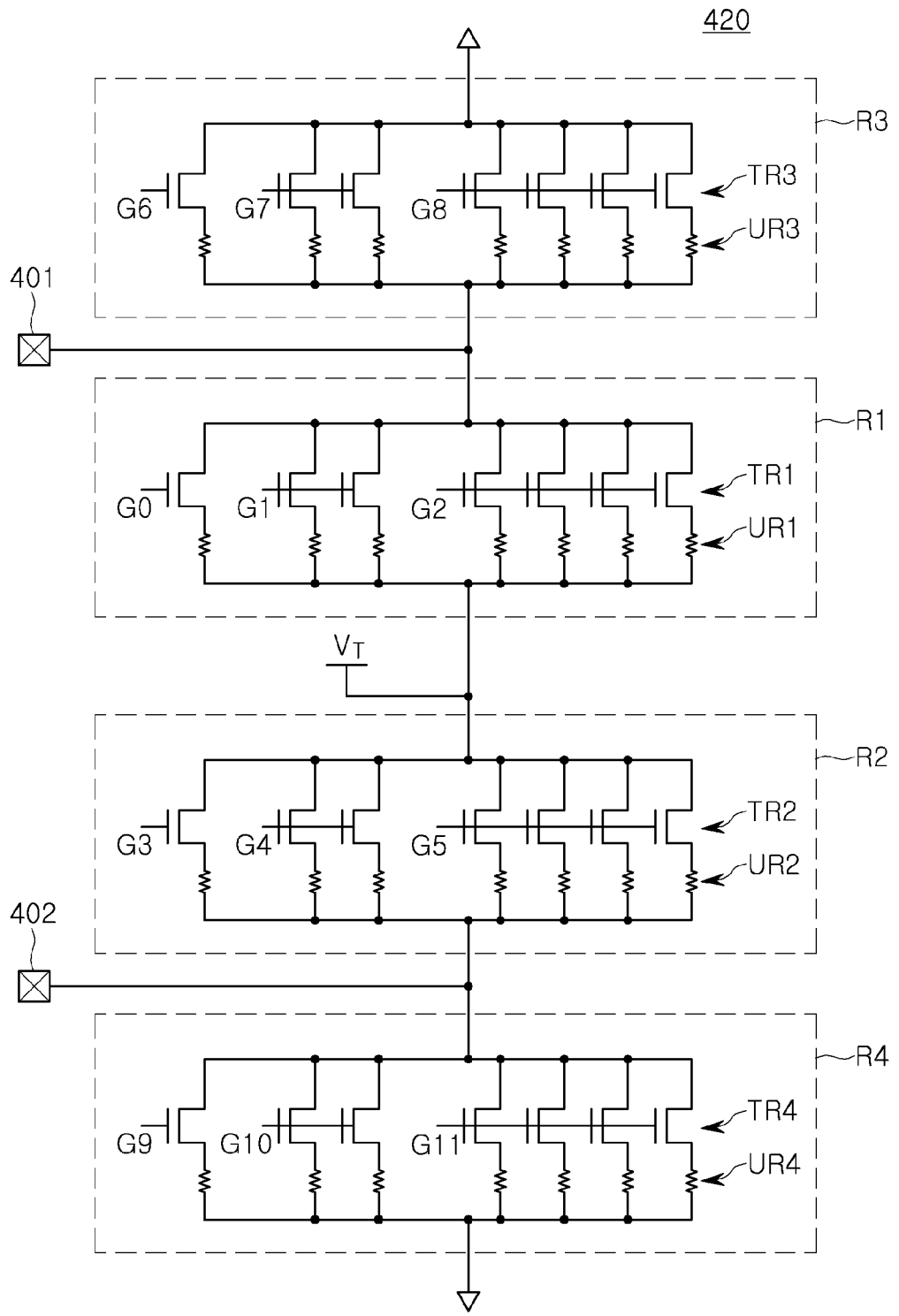

FIGS. 14 and 15 are diagrams simply illustrating a probe device according to an example embodiment.

Referring to FIG. 14, a test device may include a probe device 400 and a control device 500 connected to the probe device 400. The probe device 400 according to an example embodiment may include a first receiving terminal 401, a second receiving terminal 402, a receiving buffer 410, a resistor circuit 420, and the like. The first receiving terminal 401 is connected to a first pin (e.g., PIN1 in FIG. 13) of the probe device and may be in contact with a pad for outputting a multi-level signal from a semiconductor device during a test operation. The second receiving terminal 402 is connected to a second pin (e.g., PIN2 in FIG. 13) of the probe device and may be in contact with a pad for outputting a reference signal from the semiconductor device during the test operation. For example, the reference signal may correspond to the multi-level signal outputting on the first receiving terminal 401. In some example embodiments, the reference signal may be a ground voltage, a differential signal of the multi-level signal, or one of the plurality of reference signals in FIGS. 2 and 3.

The receiving buffer 410 may have a first input terminal connected to the first receiving terminal 401, a second input terminal connected to the second receiving terminal 402, and an output terminal outputting a multi-level signal. For example, the receiving buffer 410 may be a comparator. The resistor circuit 420 may include a plurality of resistors R1 to R4 connected to the first receiving terminal 401 and the second receiving terminal 402.

In an example embodiment, the resistor circuit 420 may include a first resistor R1 connected between the first receiving terminal 401 and a first power node 403, a second resistor R2 connected between the second receiving terminal 402 and the first power node 403, a third resistor R3 connected between the first receiving terminal 401 and a second power node 404, and a fourth resistor R4 connected between the second receiving terminal 402 and the second power node 404. In the example embodiment illustrated in FIG. 14, each of the first to fourth resistors R1 to R4 is illustrated as a variable resistor; however, at least one of the first to fourth resistors R1 to R4 may have a fixed resistance value. A first termination voltage VT may be applied to the first power node 403, and a reference signal may be applied to the second power node 404, for example, a ground voltage smaller than the first termination voltage VT.

The control device 500 may include an oscilloscope configured to check the multi-level signal output from the receiving buffer 410.

Resistance values of each of the first to fourth resistors R1 to R4 and a level of the first termination voltage VT may be determined according to a termination mode. An operation of the resistor circuit 420 according to the termination mode will be described later with reference to FIGS. 16 to 18.

FIG. 15 is a diagram illustrating an example embodiment of the resistor circuit 420. Referring to FIG. 15, the first resistor R1 may include two or more unit circuits in which a first switch element TR1 and a first unit resistance element UR1 are connected to each other in series. Each unit circuit may include a switch element and a resistor connected to each other in series. The unit circuits in the first resistor R1 may be connected in parallel with each other. Each of the second to fourth resistors R2 to R4 may have a structure similar to that of the first resistor R1. According to example embodiments, at least some of first to fourth switch elements TR1 to TR4 have different characteristics, or at least some of first to fourth unit resistance elements UR1 to UR4 may have different resistance values. As an example, at least some of the first to fourth switch elements TR1 to TR4 may have different turn-on resistances. As an example, one or more unit circuits of each of the first to fourth resistors R1 to R4 may have different turn-on resistances from the remaining unit circuits of each of the first to fourth resistors R1 to R4.

In an embodiment, each of the first through fourth switch elements TR1 to TR4 may include a plurality of transistors. In some example embodiments, each of the first through fourth switch elements TR1 to TR4 may include NMOS transistors. In some example embodiments, each of the first and second switch elements TR1 and TR2 may include PMOS transistors and each of the third and fourth switch elements TR3 and TR4 may include NMOS transistors.

The control device 500 connected to the probe device 400 may provide gate signals G0 to G11 to each of the first to fourth resistors R1 to R4 to determine resistance values of the first to fourth resistors R1 to R4. In this case, the control device 500 may include a code generator configured to generate the gate signals G0 to G11. Depending on example embodiments, at least one of the first to fourth resistors R1 to R4 may include only the switch elements TR1 to TR4 without the unit resistance elements UR1 to UR4. In this case, resistance values of the first to fourth resistors R1 to R4 may be determined by turn-on resistances of the switch elements TR1 to TR4.

Figure 16:
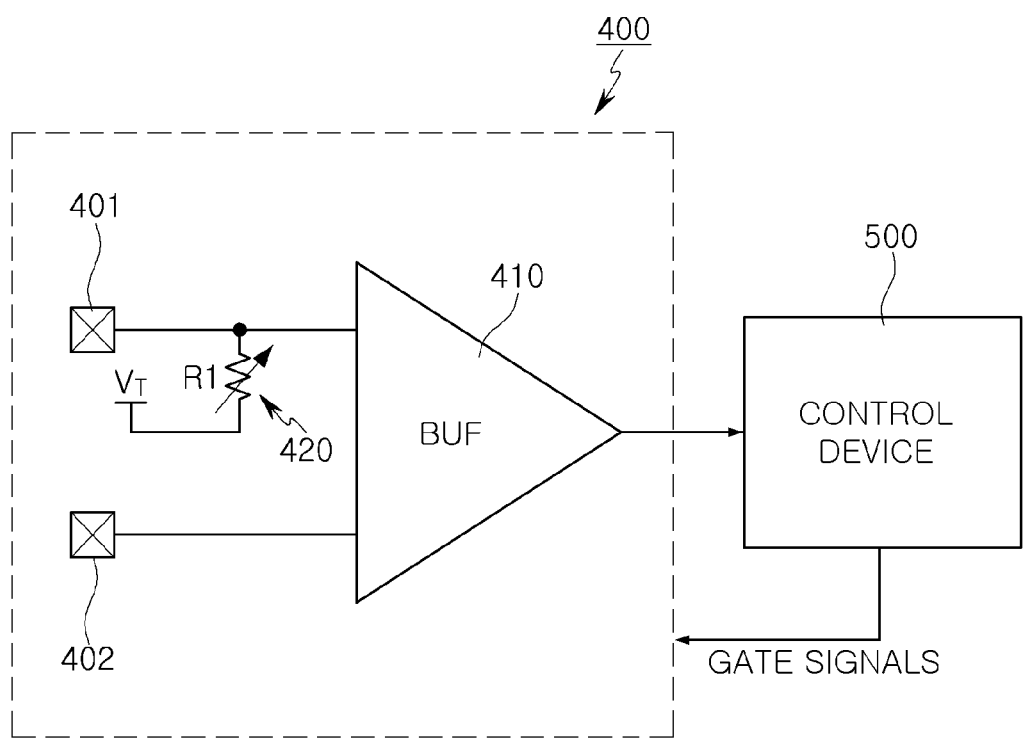
FIGS. 16 to 18 are diagrams provided to illustrate an operation of a probe device according to example embodiments.
Figure 17:
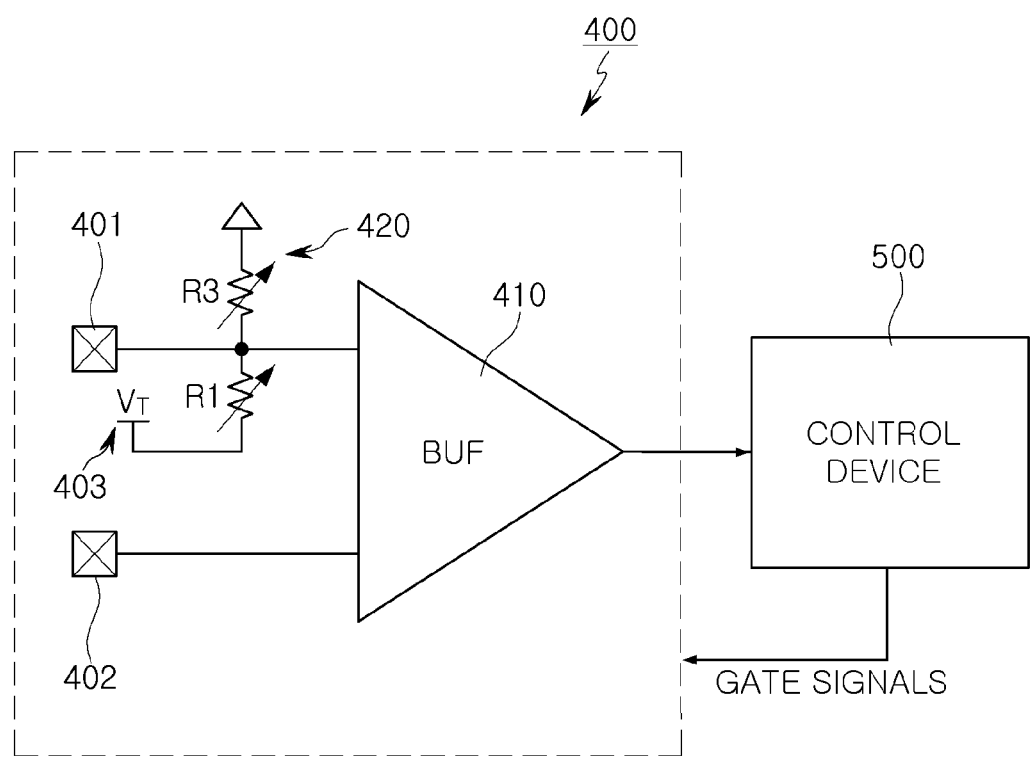
Figure 18:
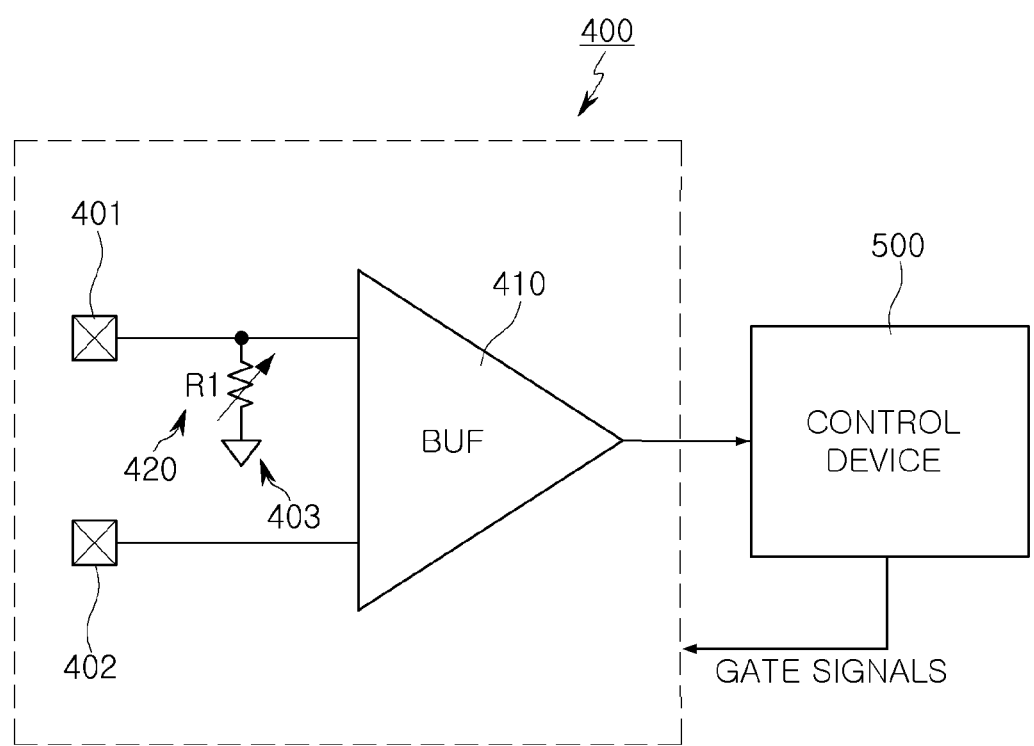

FIGS. 16 to 18 are diagrams provided to illustrate an operation of a probe device according to example embodiments.

In the example embodiment illustrated in FIG. 16, a termination mode may be a pseudo-open-drain (POD) termination mode. Referring to FIG. 16, each of the second to fourth resistors R2 to R4 in the POD termination mode may be electrically separated from the first receiving terminal 401 and the second receiving terminal 402. As an example, in the example embodiment described with reference to FIG. 15, the second to fourth resistors R2 to R4 are turned off by the gate signals G3 to G11 input to the second to fourth switch elements TR2 to TR4, the probe device 400 may support the POD termination mode. For example, resistance values of the second to fourth resistors R2 to R4 are set to infinity, and that of the first resistor R1 may be determined as a combined resistance of the first unit resistance elements UR1. Accordingly, the first resistor R1 may be defined as having a smaller resistance value than those of the second to fourth resistors R2 to R4.

Meanwhile, in the POD termination mode, a level of the first termination voltage VT may be set to a level greater than a ground level. In an example embodiment, the level of the first termination voltage VT may be equal to the maximum level among levels of power voltages input to the driver which outputs multi-level signals. For example, the level of the first termination voltage VT may be the first power voltage VDD.

In the example embodiment illustrated in FIG. 17, the termination mode may be a center tap termination (CTT) mode. Referring to FIG. 17, in the center tap termination mode, the second resistor R2 and the fourth resistor R4 are electrically separated from the second receiving terminal 402, and the first resistor R1 and the third resistor R3 may be connected to the first receiving terminal 401. The level of the first termination voltage VT may be equal to the maximum level among the levels of power voltages input to the driver outputting the multi-level signal, similar to the pseudo open-drain termination mode. For example, the level of the first termination voltage VT may be the first power voltage VDD.

In the example embodiment illustrated in FIG. 17, the first resistor R1 and the third resistor R3 may have the same resistance value. Further, as the second and fourth switch elements TR2 and TR4 are turned off in the second resistor R2 and the fourth resistor R4, each of the second resistor R2 and the fourth resistor R4 may be defined as having an infinite resistance value. Accordingly, the resistance values of the first and third resistors R1 and R3 may be smaller than those of the second and fourth resistors R2 and R4.

In the example embodiment illustrated in FIG. 18, the termination mode may be a low tap termination (LTT) mode. Referring to FIG. 18, the second to fourth resistors R2 to R4 in the LTT mode are electrically separated from the first receiving terminal 401 and the second receiving terminal 402, and the first resistor R1 may be connected to the first receiving terminal 401. The first termination voltage VT of the first power node 403 may be set to a ground voltage. Similar to the POD termination mode, the resistance value of the first resistor R1 may be defined as being smaller than those of the second to fourth resistors R2 to R4 in the LTT mode. In an example embodiment, the resistance value of each of the first to fourth resistors R1 to R4 in FIG. 18 may be equal to the resistance value of each of the first to fourth resistors R1 to R4 in FIG. 16.

Figure 19:
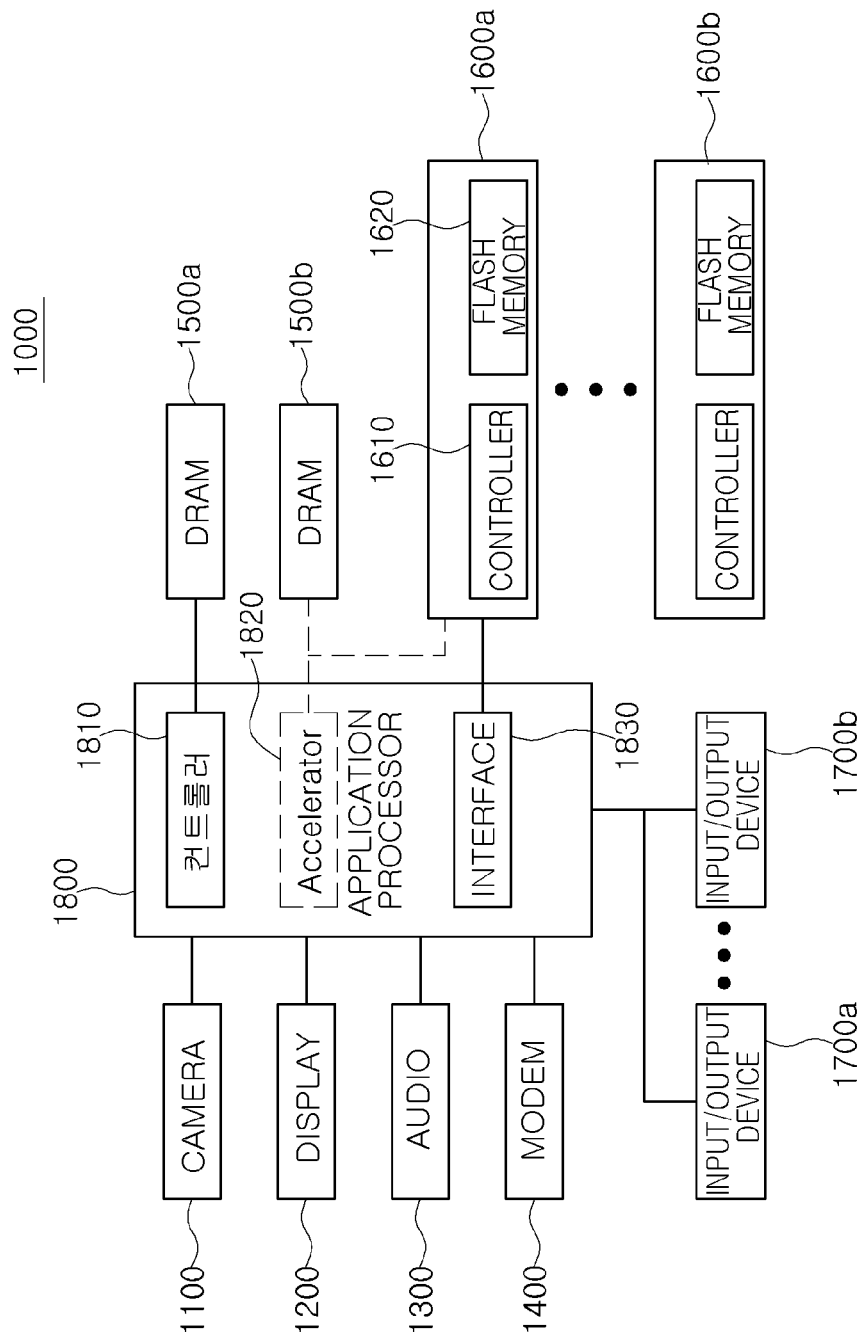
FIG. 19 is a diagram simply illustrating a mobile system including a semiconductor device according to an example embodiment.

FIG. 19 is a diagram simply illustrating a mobile system including a semiconductor device according to an example embodiment.

Referring to FIG. 19, a mobile system 1000 may include a camera 1100, a display 1200, an audio processing unit 1300, a modem 1400, dynamic random access memories (DRAMs) 1500a and 1500b, flash memory devices 1600a and 1600b, input/output devices 1700a and 1700b, and an application processor (hereinafter, "AP") 1800.

The mobile system 1000 may be implemented as a laptop computer, a portable terminal, a smartphone, a tablet PC, a wearable device, a healthcare device, or an Internet-of-Things (IoT) device. In addition, the mobile system 1000 may be implemented as a server or a personal computer.

The camera 1100 may capture a still image or a video under user's control. The mobile system 1000 may acquire specific information using a still image/video captured by the camera 1100 or may convert the still image/video into another type of data such as text and store the data. Alternatively, the mobile system 1000 may recognize a character string included in the still image/video captured by the camera 1100 and provide a text or audio translation corresponding to the character string. As such, fields in which of the camera 1100 is utilized in the mobile system 1000 are increasingly diversified. In an example embodiment, the camera 1100 may transmit data such as a still image/video to the AP 1800 according to a D-Phy or C-Phy interface based on the MIPI standard.

The display 1200 may be implemented in various forms such as a liquid crystal display (LCD), an organic light emitting diodes (OLED) display, active-matrix organic light-emitting diode (AM-OLED), plasma display panel (PDP), field emission display (FED), or electronic paper. In an example embodiment, the display 1200 may also be used as an input device of the mobile system 1000 by providing a touch screen function. In addition, the display 1200 may be provided integrally with a fingerprint sensor, or the like, to provide a security function of the mobile system 1000. In an example embodiment, the AP 1800 may transmit image data to be displayed on the display 1200, to the display 1200, according to the D-Phy or C-Phy interface based on MIPI standards.

The audio processing unit 1300 may process audio data stored in the flash memory devices 1600a and 1600b or audio data included in content received externally through the modem 1400 or the input/output devices 1700a and 1700b. For example, the audio processing unit 1300 may perform various processes such as coding/decoding, amplification, noise filtering for audio data, and the like.

The modem 1400 modulates and transmits signals to transmit/receive wired/wireless data and demodulates the signals received externally to restore original signal. The input/output devices 1700a and 1700b are devices which provide digital input/output, and may include a port which may be connected to an external recording medium, an input device such as a touch screen, a mechanical button key, or the like, an output device outputting vibrations in a haptic or other schemes, and the like. In some examples, the input/output devices 1700a and 1700b may be connected to an external recording medium through ports such as a USB, a lightning cable, an SD card, a micro SD card, a DVD, a network adapter, or the like.

The AP 1800 may control an overall operation of the mobile system 1000. In detail, the AP 1800 may control the display 1200 such that a part of the contents stored in the flash memory devices 1600a and 1600b is displayed on the screen. In addition, when an user input is received through the input/output devices 1700a and 1700b, the AP 1800 may perform a control operation corresponding to the user input.

The AP 1800 may be provided as a system-on-chip (SoC) driving an application program, an operating system (OS), or the like. Further, the AP 1800 may be included in a single semiconductor package and other devices included in the mobile system 1000, for example, the DRAM 1500a, a flash memory 1620, and/or a memory controller 1610. For example, the AP 1800 and at least one or more devices may be provided in the form of a package, such as package-on-package (PoP), ball grid arrays (BGAs), Chip scale packages (CSPs), System-In-Package (SIP), multi chip package (MCP), wafer-level fabricated package (WFP), wafer-level processed stack package (WSP), or the like. A kernel of an operating system running on the AP 1800 may include a device driver for controlling the flash memory devices 1600a and 1600b and an input/output scheduler. The device driver may control access performance of the flash memory devices 1600a and 1600b by referring to a number of synchronous queues managed by the input/output scheduler or may control a CPU mode inside the SoC, Dynamic Voltage and Frequency Scaling (DVFS) level, or the like.

In an example embodiment, the AP 1800 may include a processor block executing an operation or driving an application program and/or an operating system, and various other peripheral components connected to a processor block through a system bus. The peripheral components may include a memory controller, internal memory, power management block, error detection block, monitoring block, and the like. The processor block may include one or more cores, and in the case in which a plurality of cores are included in the processor block, each of the cores includes a cache memory, and a common cache shared by the cores may be included in the processor block.

In an example embodiment, the AP 1800 may also include an accelerator block 1820, which is a dedicated circuit for AI data computation. Alternatively, according to example embodiments, a separate accelerator chip may be provided separately from the AP 1800, and a DRAM 1500b may be additionally connected to the accelerator block 1820 or the accelerator chip. The accelerator block 1820 is a functional block professionally performing a specific function of the AP 1800 and may include a graphics processing unit (GPU), a functional block specializing in processing graphic data, a neural processing unit (NPU), a block professionally performing AI calculation and inference, a data processing unit (DPU), a block specializing in data transmission, and the like.

According to an example embodiment, the mobile system 1000 may include a plurality of DRAMs 1500a and 1500b. In an example embodiment, the AP 1800 may include a controller 1810 controlling the DRAMs 1500a and 1500b, and the DRAM 1500a may be directly connected to the AP 1800.

The AP 1800 controls the DRAM by setting commands and mode register set (MRS) conforming to JEDEC standards or may perform communications by setting specifications and functions, such as low voltage/high speed/reliability, required by the mobile system 1000, and DRAM interface protocol for CRC/ECC. For example, the AP 1800 may communicate with the DRAM 1500a through an interface conforming to the JEDEC standards such as LPDDR4, LPDDR5, or the like. Alternatively, the AP 1800 may set a new DRAM interface protocol to control the DRAM 1500b for an accelerator, in which the accelerator block 1820 or an accelerator chip provided separately from the AP 1800 has a higher bandwidth than that of the DRAM 1500a, thereby performing communications.

Although only DRAMs 1500a and 1500b are illustrated in FIG. 19, a configuration of the mobile system 1000 is not necessarily limited thereto. Memories other than DRAMs 1500a and 1500b may also be included in the mobile system 1000 depending on bandwidths, response speeds and voltage conditions of the AP 1800 or the accelerator block 1820. As an example, the controller 1810 and/or the accelerator block 1820 may control various memories such as phase-change RAM (PRAM), static RAM (SRAM), magnetic RAM (MRAM), resistive RAM (RRAM), ferroelectric RAM (FRAM), hybrid RAM, and the like. The DRAMs 1500a and 1500b have a relatively low latency and a high bandwidth than the input/output devices 1700a and 1700b or the flash memory devices 1600a and 1600b. The DRAMs 1500a and 1500b may be initialized at a power-on time point of the mobile system 1000 and may be used as temporary storage locations for the operating system and application data or as execution spaces for various software codes, when the operating system and application data are loaded.

In the DRAMs 1500a and 1500b, arithmetic operations, such as addition/subtraction/multiplication/dividing, vector operations, address operations, or FFT operations data may be stored. In another example embodiment, the DRAMs 1500a and 1500b may be provided as a processing-in-memory (PIM) equipped with a calculation function. As an example, a function for performing a function used for inference in the DRAMs 1500a and 1500b may be performed. In this case, the inference may be performed in a deep learning algorithm using an artificial neural network. The deep learning algorithm may include a training operation of training a model through various data and an inference operation of recognizing data with the trained model. For example, the function used for the inference may include a hyperbolic tangent function, a sigmoid function, a rectified linear unit (ReLU) function, and the like.

As an example embodiment, an image captured through the camera 1100 by a user may be signal-processed and stored in the DRAM 1500b, and the accelerator block 1820 or accelerator chip may perform the AI data operation of recognizing data using data stored in the DRAM 1500b and the function used for inference.

According to an example embodiment, the mobile system 1000 may include a plurality of storages or a plurality of flash memory devices 1600a and 1600b having a greater capacity than the DRAMs 1500a and 1500b. The flash memory devices 1600a and 1600b may include the memory controller 1610 and the flash memory 1620. The memory controller 1610 receives control commands and data from the AP 1800 and writes data to the flash memory 1620 in response to the control command or reads data stored in the flash memory 1620 and may transmit the data to the AP 1800.

According to an example embodiment, the accelerator block 1820 or the accelerator chip may perform training operations and the AI data calculations using the flash memory devices 1600a and 1600b. In an example embodiment, operation logic capable of executing a predetermined operation inside the flash memory devices 1600a and 1600b may be implemented in the controller 1610, and the operation logic may execute at least a portion of the training operations and the operation of the inference AI data performed by the AP 1800 and/or the accelerator block 1820, in place, using the data stored in the flash memory 1620.

In an example embodiment, the AP 1800 may include an interface 1830, and accordingly, the flash memory devices 1600a and 1600b may be directly connected to the AP 1800. For example, the AP 1800 may be implemented as a SoC, and the flash memory device 1600a may be implemented as a separate chip different from the AP 1800. The AP 1800 and the flash memory device 1600a may be mounted in one package. However, the example embodiments are not limited thereto, and the plurality of flash memory devices 1600a and 1600b may be electrically connected to the mobile system 1000 through a connection.

The flash memory devices 1600a and 1600b may store data, such as still images/movies captured by the camera 1100, or may store data received through a communication network and/or ports included in the input/output devices 1700a and 1700b, and for example, may store augmented reality/virtual reality, high definition (HD), or ultra high definition (UHD) contents.

In the example embodiment illustrated in FIG. 19, at least a portion of the configurational elements included in the mobile system 1000 may exchange data using the multi-level signal. As an example, the DRAMs 1500a and 1500b and/or the flash memory devices 1600a and 1600b may exchange data with the AP 1800 using the multi-level signal. The probe device according to the example embodiment may be used in devices including drivers outputting multi-level signals, such as the DRAMs 1500a and 1500b, the flash memory devices 1600a and 1600b, the AP 1800, or the like.

As set forth above, according to example embodiments, a multi-level signal can be detected by allowing a pin of a probe device to be in contact with a pad of a semiconductor device outputting the multi-level signal, setting a magnitude of a termination resistor appropriate for the multi-level signal in a resistor circuit inside the probe device, before packaging the semiconductor device. Accordingly, a ratio of level mismatch (RLM) of the multi-level signal can be accurately measured, and productivity of the semiconductor device can be improved by testing the semiconductor device according to various termination resistor conditions.

Various advantages and beneficial effects of the present invention are not limited to the foregoing, it will be readily understood in the course of describing the specific embodiments of the present invention.

While example embodiments have been illustrated and described above, it will be apparent to those skilled in the art that modifications and variations could be made without departing from the scope of the present disclosure as defined by the appended claims.

What is claimed is:

1. A probe device, comprising:
    a first receiving terminal configured to receive a multi-level signal having M levels, where M is a natural number greater than 2;
    a second receiving terminal configured to receive a reference signal;
    a receiving buffer including a first input terminal connected to the first receiving terminal, a second input terminal connected to the second receiving terminal, and an output terminal configured to output the multi-level signal based on signals received from the first input terminal and the second input terminal; and
    a resistor circuit comprising a plurality of first resistors connected to the first receiving terminal and a plurality of second resistors connected to the second receiving terminal, and the resistor circuit configured to determine a magnitude of a termination resistance of the first receiving terminal and the second receiving terminal.

2. The probe device of claim 1, wherein,
    the plurality of first resistors of the resistor circuit comprises first and third resistors,
    the plurality of second resistors of the resistor circuit comprises second and fourth resistors,
    the first resistor is connected between the first receiving terminal and a first power node, the second resistor is connected between the second receiving terminal and the first power node, the third resistor is connected between the first receiving terminal and a second power node, and the fourth resistor is connected between the second receiving terminal and the second power node.

3. The probe device of claim 2, wherein at least one of the first to fourth resistors is a variable resistor.

4. The probe device of claim 2, wherein a first termination voltage is applied to the first power node and a second termination voltage is applied to the second power node, and wherein the first termination voltage has a level determined according to a termination mode of a semiconductor device, and the second termination voltage has a fixed level.

5. The probe device of claim 4, wherein a resistance value of each of the first to fourth resistors and the level of the first termination voltage are determined according to the termination mode.

6. The probe device of claim 5, wherein, when the termination mode is a pseudo-open drain (POD) termination mode, the level of the first termination voltage is set as a first level greater than a ground level, and the resistance value of the first resistor is set to be lower than the resistance value of each of the second to fourth resistors.

7. The probe device of claim 5, wherein, when the termination mode is a center tap termination (CTT) mode, the level of the first termination voltage is set as a first level greater than a ground level, and the resistance value of each of the first and third resistors are set to be lower than the resistance value of each of the second and fourth resistors.

8. The probe device of claim 5, wherein, when the termination mode is a low tap termination (LTT) mode, the level of the first termination voltage is set to be equal to the level of the second termination voltage, and the resistance value of the first resistor is set to be lower than the resistance value of each of the second to fourth resistors.

9. The probe device of claim 2, wherein each of the first to fourth resistors comprises a plurality of unit circuits, each of the plurality of unit circuits having a switch element and a unit resistor connected to each other in series.

10. The probe device of claim 1, further comprising:
a first pin connected to the first receiving terminal; and
a second pin connected to the second receiving terminal,
wherein the first receiving terminal is configured to receive the multi-level signal through the first pin, and
wherein the second receiving terminal is configured to receive the reference signal through the second pin.

11. The probe device of claim 1, wherein the resistor circuit is configured to provide a variable external resistor used to perform a ZQ calibration of a semiconductor device configured to output the multi-level signal.

12. A test device, comprising:
a probe device configured to contact an output pad of a semiconductor device configured to output a multi-level signal having M levels, where M is a natural number greater than 2; and
a control device configured to receive the multi-level signal from the probe device and test the semiconductor device using the multi-level signal,
wherein the probe device comprises a resistor circuit having:
a first receiving terminal configured to receive the multi-level signal,
a second receiving terminal configured to receive a reference signal, and
a plurality of resistors connected to the first receiving terminal and the second receiving terminal, and
wherein the control device is configured to determine a resistance value of the resistor circuit, as a termination resistance value for testing the multi-level signal.

13. The test device of claim 12, wherein the test device is configured to test a ratio of level mismatch (RLM) of the multi-level signal at a wafer level of the semiconductor device.

14. The test device of claim 12, wherein the semiconductor device includes a memory device, and
wherein the probe device is configured to contact a data output pad of the memory device.

15. The test device of claim 12, wherein the control device is configured to change at least one of resistance value of each of the plurality of resistors and a level of a termination voltage applied to the plurality of resistors according to a termination mode of the semiconductor device.

16. The test device of claim 15, wherein the resistance value of each of the plurality of resistors when the termination mode is a low tap termination mode is equal to the resistance value of each of the plurality of resistors when the termination mode is a pseudo-open drain termination mode.

17. The test device of claim 15, wherein the level of the termination voltage when the termination mode is a pseudo-open drain termination mode is equal to the level of the termination voltage when the termination mode is a center tap termination mode.

18. The test device of claim 12, wherein the probe device comprises a first pin and a second pin protruding externally and being adjacent to each other,
wherein, during testing of the semiconductor device, the first pin contacts a signal pad outputting the multi-level signal, of the semiconductor device and the second pin contacts a reference pad outputting a reference signal, of the semiconductor device.

19. A test method for a semiconductor device, the test method comprising:
contacting a first pin and a second pin of a probe device to a signal pad and a ground pad of the semiconductor device;
setting a resistance value of each of a plurality of variable resistors, in the probe device, connected to the first pin and the second pin according to a termination mode of the semiconductor device;
supplying a power voltage to the semiconductor device; and
verifying a multi-level signal output from the signal pad by the semiconductor device,
wherein the multi-level signal is a pulse amplitude-modulation signal having M levels, where M is a natural number greater than 2.

20. The test method of claim 19, wherein each of the plurality of variable resistors comprises at least one of unit circuit having a switch element and a unit resistor connected to each other in series, and
wherein the switch element included in at least one of the plurality of variable resistors is turned off while the semiconductor device outputs the multi-level signal.

* * * * *